MOUNTING CIRCUIT ELEMENTS IN PRINTED CIRCUIT BOARDS

Filed Dec. 19, 1966

INVENTOR
MARK STEIDLITZ

BY Hubbell, Cohen & Stiefel
ATTORNEYS.

3,417,294

MOUNTING CIRCUIT ELEMENTS IN PRINTED CIRCUIT BOARDS

Mark Steidlitz, Cherry Hill, N.J., assignor to EMC Technology, Inc., Philadelphia, Pa., a corporation of Pennsylvania Filed Dec. 19, 1966, Ser. No. 602,956
5 Claims. (Cl. 317—101)

ABSTRACT OF THE DISCLOSURE

A printed circuit board is drilled with holes that are complementary to a circuit element having a tab type terminal to thereby receive the element within the hole with the tab in conducting relation with the printed circuit on the board. This assembly is then sandwiched between other boards such as conductive ground plane boards to make a complete circuit package.

CROSS REFERENCES TO RELATED APPLICATIONS

The present invention finds its main utility in the mounting of circuit elements of the type described and claimed in my application Ser. No. 505,779, filed by me on Nov. 1, 1965, for "Stripline Termination Device," and assigned to the assignee hereof.

BACKGROUND OF THE INVENTION

*Field of the invention*

The present invention relates to a method of mounting a circuit element in a printed circuit board, especially of the stripline type.

*Description of the prior art*

Circuit elements are generally connected into printed circuits by disposing the circuit element on the dielectric board supporting the printed circuit and then connecting the terminals of the circuit element to the circuit printed thereon, said connection being effected generally by soldering or the like. Such prior art method has several significant drawbacks which are overcome by the present invention. First, the circuit element, resting on the surface of the printed circuit board, takes up additional space which tends to make the overall circuit array more bulky. In the present invention, the circuit board is provided with a recess which is complementary to the circuit element whereby the circuit element may be disposed within said aperture and take up no useable space. Secondly, the method of connecting the upstanding terminals of the circuit device into the printed circuit is often time consuming and costly. In the present invention this is eliminated by providing the circuit element with a flat tab-type connector which is sandwiched into electrical connecting relation with the printed circuit.

SUMMARY

The present invention finds its major utility in connection with circuit devices of the type described in my aforementioned U.S. patent application Ser. No. 505,779. Such a device has a conductive body, preferably cylindrical in form, with a cavity extending therein through the peripheral side wall of the conductive body. A flat resistor is disposed at least partially within the cavity and has one end thereof connected to the conductive body. The remainder of the resistor is spaced from the conductive body as by dielectric material. Connected to the resistor is a tab-type terminal which extends out beyond the peripheral wall of the circuit element.

In connection preferably with such circuit elements, a stripline circuit is printed on an insulated circuit board as desired. A location is selected for the circuit element and a hole is formed in the circuit board which is complementary to the peripheral configuration of the circuit element. The circuit element is then dropped into the hole so that its terminal is in connective relationship with the printed circuit on the board. Preferably the terminal of the circuit element is disposed midway between the two ground planes thereof and parallel thereto. When such is the case, the circuit board is preferably equal to one-half of the thickness of the circuit element. Accordingly, one-half of the circuit device will be disposed within the aperture provided in the circuit board. A second insulating board of equal thickness to the first insulating board may be provided with a complementary aperture simultaneously with the provision of the aperture in the first circuit board. This second insulating circuit board is disposed over the first circuit board whereby to sandwich the circuit element terminal therebetween in conductive relation with the printed circuit on the circuit board, with the circuit element filling both apertures in both circuit boards. Thereafter, ground plane conductive boards such as aluminum boards may be disposed above and below the assembly and the entire assembly may then be fixed by adhesives, mechanical connectors or potting or the like to make a complete printed circuit board assembly.

DESCRIPTION OF THE PREFERRED EMBODIMENTS

Figures 1, 2, 3, 4, 5, 6, 7, 8, 9, 10:
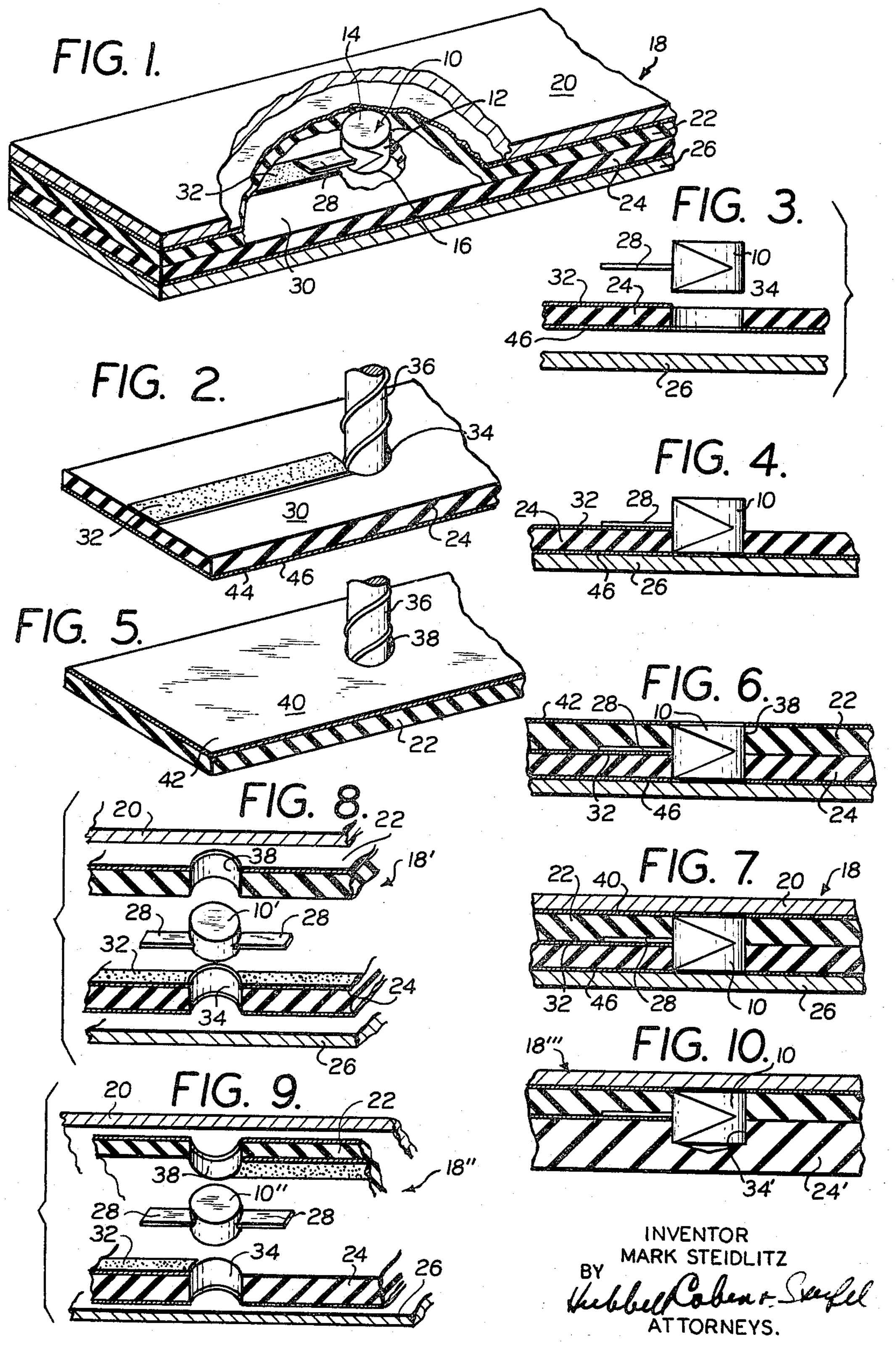
FIG. 1 is a perspective view of a preferred printed stripline circuit incorporating a circuit element of the type heretofore mentioned with portions broken away to more clearly illustrate the present invention.
FIG. 2 is a perspective view of a printed circuit board in the process of being drilled to receive a cylindrical circuit device.
FIG. 3 is an exploded view in vertical section of a circuit device, a printed circuit board drilled to receive the circuit device and a ground board disposed thereunder.
FIG. 4 is a view similar to FIG. 3 showing the parts in assembled relationship.
FIG. 5 is a view similar to FIG. 2 showing the drilling of a second insulating board to be disposed over the circuit element in FIG. 4.
FIG. 6 is a view similar to FIG. 4 showing the second circuit board disposed over the circuit element.
FIG. 7 is a view similar to FIG. 6 showing an upper grounding board disposed over the second insulating board.
FIG. 8 is an exploded perspective view of a circuit package embodying the present invention with the circuit element having two terminals.
FIG. 9 is a view similar to FIG. 8 showing a further modification of the present invention.
FIG. 10 is a view similar to FIG. 7 showing a further modification of the present invention.

Referring now to the drawings in detail, and especially to FIG. 1 thereof, a cylindrical circuit element 10 having a cylindrical peripheral side wall 12, an upper planar surface 14 and a lower planar surface 16 is shown mounted in a stripline circuit board assembly 18 in accordance with the present invention. Preferably the major portion of the body of circuit element 10, and especially the upper and lower surfaces 14 and 16 are conductive, as in said U.S. application Ser. No. 505,779. The circuit board assembly 18 includes an upper conductive backing board 20, preferably solidly metallic although a coated dielectric board could serve, an upper dielectric board 22, a lower dielectric board 24, and a lower conductive backing board 26. The dielectric boards 22 and 24 each are provided with circular cavities or apertures to receive the upper and lower portions, respectively, of the circuit element 10 with the flat tab-type terminal 28 thereof sandwiched in between. In accordance with the present invention the lower insulated board 24 has printed on its upper surface 30 a printed circuit here shown to be a stripline circuit 32. The entire assembly 18 is held together in any suitable fashion as by connector elements or potting, although adhesives may also be employed.

The preferred method of the present invention is illustrated in FIGS. 2 through 7 hereof in connection with a termination device of the type described and claimed in my aforementioned U.S. Patent application Ser. No. 505,-779. It will be understood however that the present invention is not limited to use of such a circuit element and may be employed with any circuit element coming within the scope of the claims appended hereto.

In the initial step of the present method, a dielectric board 24 is provided on its upper surface 30 with a printed circuit including a conductive element 32. Preferably the circuit is of the stripline type. At a point in the conductive element 32 where it is desired to include a circuit element 10, such as a resistor, capacitor, attenuator or the like, a hole or aperture 34 is provided as by a drill 36. Assuming the peripheral wall of the circuit element 10 is cylindrical, then the hole 34 will also be cylindrical. Naturally, other shapes may be provided although not by rotary drills. Preferably, the thickness of the circuit board 24 is equal to one-half of the thickness of the circuit element 10 although, as will be seen hereinafter, in certain applications this is not necessary.

The next step in the method is to provide the upper dielectric board 22 with a hole 38 as with the drill 36 which hole is also complementary to the peripheral side wall 12 of the circuit element 10. The location of the hole 38 is preferably such that when the two dielectric boards 22 and 24 are in peripheral registry, the holes 34 and 38 will register. To best achieve this, holes 34 and 38 may be drilled simultaneously in one drilling operation. As was true with respect to the insulated board 24, it is preferable that the insulated board 22 have a thickness equal to one-half of the thickness of the circuit element 10.

It is also desirable although not necessary that the upper surface of the upper dielectric board 22, that is the surface 40, be coated with a conductive coating 42 and that the lower surface 44 of the lower dielectric board 24 be coated with a conductive coating 46. As will be seen hereinafter this improves the contact with and lowers the ground resistance between the ground planes of the circuit element 10 and the ground planes of the assembly 18.

After the upper and lower dielectric boards 22 and 24, respectively, are provided with the apertures 38 and 34 as shown in FIGS. 2 and 5, the lower conductive backing board 26 is placed in position and the lower dielectric board 24 is disposed thereover with its conductive coating 46 brought into conductive relation with the conductive backing board 26 (see FIG. 4). The circuit element 10 is placed in the aperture 34 with its tab contact 28 in conductive engagement with the printed circuit 32 on the upper surface of the lower dielectric board 24. Then the upper dielectric board 22 is disposed over the lower dielectric board 24 with the aperture 38 therein receiving the upper portion of the circuit element 10 (FIG. 6). This sandwiches the tab-type terminal 28 between the upper and lower dielectric boards in good conducting relation with the printed circuit strip 32.

Thereafter, the upper conductive backing board 20 is laid over the upper dielectric board 22 and the entire assembly is brought into fixed relation, preferably somewhat compressed, to complete the assembly (FIG. 7). This fixed assembly provides the reception of the circuit element 10 therewithin without any increase in volume therefor, provides for automatic electrical contact between the terminal 28 and the printed circuit 32, and automatically provides ground planes for the stripline circuitry through the conductive backing boards 20 and 26 and the conductive surfaces 40 and 46, respectively.

It will be obvious that the circuit element 10 may be any form of circuit element and is not limited to one having only one tab-type terminal 28. For example, it could have a multiple number of tab terminals 28, each of which are brought into engagement with a respective portion of the printed circuit 32 to complete contact therebetween. This is best illustrated in FIGS. 8 and 9 which show exploded perspective views of the circuit board assemblies 18' and 18", respectively, each of which is adapted to receive a circuit element 10' and 10" having two tab-type terminals 28. It will be noted with regard to FIGS. 8 and 9 that the major difference therebetween is in the manner of printing the circuit. In FIG. 8 it will be seen that the entire circuit 32 is printed on the lower dielectric board 24 whereas in FIG. 9, portions of the printed circuit 32 are printed on the upper surface of the lower dielectric board 24 and other portions are printed on the lower surface of the upper dielectric board 22. Apart from these changes, the manner of assembly of the circuit board assemblies 18' and 18" is precisely the same as that described above with respect to FIGS. 1 through 7.

While the present invention has found its major utilization in stripline circuitry requiring upper and lower ground planes, it is possible to employ the same inventive concepts in connection with other types of printed circuitry. For example, in FIG. 10, the circuit element 10 may be dropped into a recess 34' in lower dielectric board 24 which recess does not extend entirely through the dielectric board 24, the dielectric board 24 having a thickness substantially in excess of half the thickness of the circuit element 10. Such an assembly 18''' may not include a lower backing board 26 as it will be unnecessary therein.

In other applications, not illustrated, the upper dielectric board 22 may be constructed in precisely the same way as the lower dielectric board 24' of FIG. 10 whereby to eliminate the upper conductive backing board 20 as well as the lower conductive backing board 26. It would depend upon the specific circuit requirements and the nature of the printed circuits being employed as to whether or not the overall assembly as shown in FIG. 1 is required.

In any event, it is necessary to provide two dielectric boards, each having recesses which, when registered, form a cavity complementary to the circuit element to be incorporated therein with an outwardly extending terminal sandwiched therebetween to effect contact with circuitry printed on at least one of the confronting surfaces of the dielectric board sandwich.

While I have herein shown and described the preferred form of the present invention and have suggested modifications therein, other changes and modifications may be made therein within the scope of the appended claims without departing from the spirit and scope of this invention.

What is claimed is:

1. In a printed circuit assembly including a circuit element having a peripheral side wall, upper and lower surfaces, and a flat terminal extending from said peripheral side wall, the improvement comprising:

(a) a lower dielectric board having a recess therein complementary to the periphery of said circuit element and of a depth substantially equal to the thickness of said circuit element between said terminal and said lower surface;

(b) an upper dielectric board having a recess therein complementary to the periphery of said circuit element and of a depth substantially equal to the thickness of said circuit element between said terminal and said upper surface;

(c) said lower and upper dielectric boards being in close confronting relation with said recesses in registry to form a cavity;

(d) a conductive printed circuit line on one of the confronting surfaces of said upper and lower dielectric boards and extending substantially to the periphery of said cavity; and (e) said circuit element being disposed within said cavity with said flat terminal engaging said printed circuit line.

2. The printed circuit assembly of claim 1, wherein one of said upper and lower circuit boards has a thickness equal to the depth of said recess, whereby said recess is an aperture; and a conductive backing board overlying said one circuit board in conducting relation with the exposed surface of said circuit element.

3. The printed circuit assembly of claim 1, wherein each of said upper and lower circuit boards has a thickness equal to the depth of its respective recess, whereby each recess is an aperture; and an upper and a lower conductive backing board overlying the exposed surfaces of said upper and lower dielectric board, respectively, in conductive relation with said upper and lower surfaces of said circuit element.

4. The printed circuit assembly of claim 3, wherein said peripheral side wall of said circuit element is cylindrical, and said recesses are circular in cross-section.

5. The printed circuit assembly of claim 1, wherein said peripheral side wall of said circuit element is cylindrical, and said recesses are circular in cross-section.

References Cited

UNITED STATES PATENTS

| | | | |
|---|---|---|---|
| 2,902,628 | 9/1959 | Leno | 317—101 |
| 3,142,783 | 7/1964 | Warren | 317—101 |
| 3,235,942 | 2/1966 | Howell et al. | 174—68.5 XR |

DARRELL L. CLAY, *Primary Examiner.*

U.S. Cl. X.R.

174—68.5; 339—17; 333—84